United States Patent
Lo et al.

(10) Patent No.: US 10,833,220 B2
(45) Date of Patent: Nov. 10, 2020

(54) MICRO LIGHT EMITTING DIODE DEVICE

(71) Applicant: PlayNitride Inc., Tainan (TW)

(72) Inventors: Yu-Yun Lo, Tainan (TW); Tzu-Yang Lin, Tainan (TW); Yu-Hung Lai, Tainan (TW)

(73) Assignee: PlayNitride Inc., Tainan (TW)

( * ) Notice: Subject to any disclaimer, the term of this patent is extended or adjusted under 35 U.S.C. 154(b) by 0 days.

(21) Appl. No.: 16/396,781

(22) Filed: Apr. 29, 2019

(65) Prior Publication Data

US 2019/0252574 A1    Aug. 15, 2019

Related U.S. Application Data

(62) Division of application No. 15/786,564, filed on Oct. 17, 2017, now Pat. No. 10,326,045.

(30) Foreign Application Priority Data

Aug. 8, 2017    (CN) .......................... 2017 1 0669467

(51) Int. Cl.

| | |
|---|---|
| *H01L 33/36* | (2010.01) |
| *H01L 33/00* | (2010.01) |
| *H01L 25/16* | (2006.01) |
| *H01L 33/58* | (2010.01) |
| *H01L 33/20* | (2010.01) |
| *H01L 33/44* | (2010.01) |
| *H01L 33/52* | (2010.01) |

(Continued)

(52) U.S. Cl.
CPC ...... *H01L 33/0093* (2020.05); *H01L 21/7806* (2013.01); *H01L 25/0753* (2013.01); *H01L 25/167* (2013.01); *H01L 27/15* (2013.01); *H01L 33/007* (2013.01); *H01L 33/12* (2013.01); *H01L 33/20* (2013.01); *H01L 33/36* (2013.01); *H01L 33/44* (2013.01); *H01L 33/52* (2013.01); *H01L 33/58* (2013.01); *H01L 27/156* (2013.01)

(58) Field of Classification Search
CPC ......... H01L 33/06; H01L 33/52; H01L 33/44; H01L 33/20; H01L 33/58; H01L 33/007; H01L 33/36; H01L 25/167
See application file for complete search history.

(56) References Cited

U.S. PATENT DOCUMENTS

2013/0285080 A1*  10/2013  Naito ...................... H01L 33/38
                                                                       257/88
2018/0175248 A1*  6/2018  Ahmed .................. H01L 33/44

* cited by examiner

*Primary Examiner* — Selim U Ahmed
*Assistant Examiner* — Evan G Clinton
(74) *Attorney, Agent, or Firm* — JCIPRNET

(57) ABSTRACT

A method for manufacturing a micro light emitting diode device is provided. A connection layer and epitaxial structures are formed on a substrate. A first pad is formed on each of the epitaxial structures. A first adhesive layer is formed on the connection layer, and the first adhesive layer encapsulates the epitaxial structures and the first pads. A first substrate is connected to the first adhesive layer. The substrate is removed, and a second substrate is connected to the connection layer through a second adhesive layer. The first substrate and the first adhesive layer are removed. The connection layer located between any two adjacent epitaxial structures are partially removed to form a plurality of connection portions. Each of the connection portions is connected to the corresponding epitaxial structure, and a side edge of each of the connection portions protrudes from a side wall surface of the corresponding epitaxial structure.

11 Claims, 9 Drawing Sheets

(51) Int. Cl.
*H01L 27/15* (2006.01)
*H01L 21/78* (2006.01)
*H01L 25/075* (2006.01)
*H01L 33/12* (2010.01)

MICRO LIGHT EMITTING DIODE DEVICE

CROSS-REFERENCE TO RELATED APPLICATION

This application is a divisional application of and claims the priority benefit of U.S. application Ser. No. 15/786,564, filed on Oct. 17, 2017, now allowed, which claims the priority benefit of China application serial no. 201710669467.9, filed on Aug. 8, 2017. The entirety of each of the above-mentioned patent applications is hereby incorporated by reference herein and made a part of this specification.

BACKGROUND OF THE INVENTION

Field of the Invention

The invention is related to a light emitting device and a manufacturing method thereof, and particularly to a micro light emitting diode device and a manufacturing method thereof.

Description of Related Art

Existing manufacturing steps of a micro light emitting diode device are carried out as follows. First of all, a plurality of epitaxial structures are formed on a growth substrate, and required electrodes are formed on each of the epitaxial structures. A first adhesive layer is formed on the growth substrate to encapsulate each of the epitaxial structures and the electrodes thereof. Thereafter, the first substrate is adhered to the first adhesive layer and the growth substrate is removed. At this point, relative positions of the epitaxial structures are fixed by the first adhesive layer. Subsequently, a second substrate is adhered to the epitaxial structures and the first adhesive layer via a second adhesive layer. Lastly, the epitaxial structures are transferred to a circuit substrate.

In the process where the first adhesive layer is formed on the growth substrate and the first substrate is adhered to the first adhesive layer, since the epitaxial structures separated from each other are merely bonded to the growth substrate to fix the relative positions therebetween, the epitaxial structures may be affected by the first adhesive layer and peeled off from the growth substrate, or a crack is likely to be generated at the bonding position between the epitaxial structures and the growth substrate. On the other hand, in the process where the second substrate is adhered to the first adhesive layer via the second adhesive layer, it is required that the second adhesive layer is heated and the second substrate is laminated with the second adhesive layer. At this point, the first adhesive layer that is subjected to heat or force is deformed and affects the epitaxial structures; as a result, the relative positions of the epitaxial structures are shifted. That is to say, when the epitaxial structures are transferred to the circuit substrate, the defects generated in the above-described manufacturing steps cause the electrodes on each of the epitaxial structures unable to be precisely aligned with the electrical contact on the circuit substrate, which affects the manufacturing efficiency, yield of rate and reliability of product.

SUMMARY OF THE INVENTION

The invention provides a micro light emitting diode device which has good reliability.

The invention provides a manufacturing method of a micro light emitting diode device which is capable of improving manufacturing efficiency and yield of rate.

The manufacturing method of the micro light emitting diode device of the invention includes the following manufacturing steps. A connection layer and a plurality of epitaxial structures are formed on a substrate, wherein the epitaxial structures are separated from each other and the relative positions therebetween are fixed via the connection layer. A first pad is formed on each of the epitaxial structures, and each of the first pads and the connection layer are respectively located on two opposite sides of the epitaxial structures. A first adhesive layer is formed on the connection layer, and the first adhesive layer encapsulates the epitaxial structures and the first pad. The first substrate is connected with the first adhesive layer, and the first substrate and the substrate are respectively located on two opposite sides of the first adhesive layer. The substrate is removed, and the second substrate is connected with the connection layer via the second adhesive layer, wherein the first substrate and the second substrate are respectively disposed on the two opposite sides of the first adhesive layer. The first substrate and the first adhesive layer are removed. The connection layer located between any two adjacent epitaxial structures is partially removed so as to form a plurality of connection portions separated from each other, wherein each of the connection portions and the corresponding epitaxial structure are connected with each other, and a side edge of each of the connection portions protrudes from a side wall surface of the corresponding epitaxial structure.

In an embodiment of the invention, the manufacturing method of the micro light emitting diode device further includes bonding each of the epitaxial structures to the circuit substrate electrically via the corresponding first pad, and the connection portions and the circuit substrate are respectively located on two opposite sides of the epitaxial structures. Subsequently, the second substrate and the second adhesive layer are removed.

In an embodiment of the invention, an orthogonal projection area of each of the connection portions on the circuit substrate is larger than an orthogonal projection area of the corresponding epitaxial structure on the circuit substrate.

In an embodiment of the invention, a ratio of the orthogonal projection area of each of the connection portions on the circuit substrate to the orthogonal projection area of the corresponding epitaxial structure on the circuit substrate is larger than 1 and smaller than or equal to 1.5.

In an embodiment of the invention, the manufacturing method of the micro light emitting diode device further includes that, after the substrate is removed, a plurality of second pads are formed on the connection layer in corresponding to each of the epitaxial structures, wherein the second pads and the epitaxial structures are respectively disposed on the two opposite sides of the connection layer, and the two opposite sides of each of the epitaxial structures are respectively provided with one first pad and one second pad.

In an embodiment of the invention, when the second substrate is connected to the connection layer via the second adhesive layer, the second adhesive layer encapsulates the second pads.

In an embodiment of the invention, each of the epitaxial structures has a bonding surface connected to a side wall surface, and each of the first pads is disposed on the bonding surface of the corresponding epitaxial structure. The manufacturing method of the micro light emitting diode device further includes that, before the first adhesive layer encapsulates the epitaxial structures and the first pads, an insulating layer is formed on the bonding surface and the side wall surface of each of the epitaxial structures. Each of the insulating layers exposes the first pad on the bonding surface of the corresponding epitaxial structure.

A micro light emitting diode device of the invention includes a circuit substrate, a plurality of epitaxial structures, a plurality of first pads and a plurality of connection portions. The epitaxial structures are disposed on the circuit substrate and separated from each other. The first pads are respectively disposed on the epitaxial structures, and each of epitaxial structures is electrically bonded to the circuit substrate via the corresponding first pad. The connection portions are respectively disposed on the epitaxial structures, wherein the connection portions and the circuit substrate are respectively located on two opposite sides of the epitaxial structures, and the epitaxial structures and the circuit substrate are respectively located on two opposite sides of the first pads. A side edge of each of the connection portions protrudes from a side wall surface of the corresponding epitaxial structure.

In an embodiment of the invention, an orthogonal projection area of each of the connection portions on the circuit substrate is larger than an orthogonal projection area of the corresponding epitaxial structure on the circuit substrate.

In an embodiment of the invention, a ratio of the orthogonal projection area of each of the connection portions on the circuit substrate to the orthogonal projection area of the corresponding epitaxial structure on the circuit substrate is larger than 1 and smaller than or equal to 1.5.

In an embodiment of the invention, a ratio of the thickness of each of the connection portions to the thickness of corresponding epitaxial structure is smaller than or equal to 0.8.

In an embodiment of the invention, the micro light emitting diode device further includes a plurality of second pads, and the second pads are respectively disposed on each of the connection portions. Each of the second pads and the corresponding epitaxial structure are respectively located on two opposite sides of the corresponding connection portion, and the two opposite sides of each of the epitaxial structures are respectively provided with one first pad and one second pad.

In an embodiment of the invention, each of the epitaxial structures includes a first type semiconductor layer, a light emitting layer and a second type semiconductor layer. The first type semiconductor layer is disposed on the circuit substrate. The light emitting layer is disposed on the first type semiconductor layer. The second type semiconductor layer is disposed on the light emitting layer, and the first type semiconductor layer and the second type semiconductor layer are respectively located on two opposite sides of the light emitting layer.

In an embodiment of the invention, each of the second type semiconductor layer and the corresponding connection portion are connected together, and the thickness of each of the second type semiconductor layer is larger than the thickness of the corresponding connection portion.

In an embodiment of the invention, each of the second type semiconductor layer and the corresponding connection portion are connected together, and the thickness of each of the connection portions is larger than a sum of the thickness of the corresponding first type semiconductor layer and the thickness of the corresponding light emitting layer.

In an embodiment of the invention, the material of the connection portions includes a semiconductor material.

In an embodiment of the invention, the material of the connection portions includes a group III-V semiconductor material.

In an embodiment of the invention, the melting point of the material of the connection portions is larger than 1000° C.

In an embodiment of the invention, each of the epitaxial structures has a bonding surface connected to the side wall surface, and each of the first pad is disposed on the bonding surface of the corresponding epitaxial structure. The side wall surface and the bonding surface of each of the epitaxial structures are encapsulated by an insulating layer, and each of the insulating layers exposes the first pad on the bonding surface of the corresponding epitaxial structure.

In summary, in the manufacturing process of the micro light emitting diode device of the invention, the relative positions of the plurality of epitaxial structures on the substrate (e.g., growth substrate) may be fixed via the connection layer. In the process of forming the first adhesive layer to encapsulate the epitaxial structures, adhering the first substrate to the first adhesive layer, removing the substrate (e.g., growth substrate), forming the second adhesive layer on the connection layer and adhering the second substrate to the second adhesive layer, the relative positions of the epitaxial structures are not shifted due to the effect of external force. Therefore, when the epitaxial structures are transferred onto the circuit substrate, the pads on each of the epitaxial structures can be precisely aligned with an electrode bonding layer on the circuit substrate. In other words, the manufacturing method of the micro light emitting diode device in the invention facilitates to improve manufacturing efficiency and yield of rate, and the obtained micro light emitting diode device can have better reliability.

In order to make the aforementioned features and advantages of the disclosure more comprehensible, embodiments accompanying figures are described in detail below.

DESCRIPTION OF EMBODIMENTS

Figure 1:
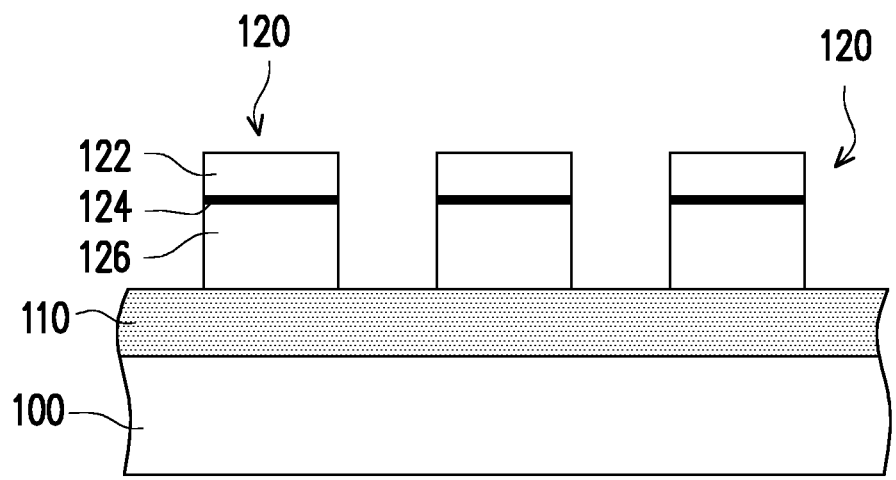
FIG. 1 to FIG. 9 are cross-sectional views illustrating a manufacturing method of a micro light emitting diode device according to an embodiment of the invention.

FIG. 1 to FIG. 9 are cross-sectional views illustrating a manufacturing method of a micro light emitting diode device according to an embodiment of the invention. First of all, referring to FIG. 1, a connection layer 110 and a plurality of epitaxial structures 120 separated from each other are formed on a substrate 100. The substrate 100 may be a growth substrate such as a sapphire substrate. In the embodiment, the connection layer 110 encapsulates one surface of the substrate 100 and connected with the substrate 100. The epitaxial structures 120 are connected with the connection layer 110 so as to fix the relative positions therebetween, and the substrate 100 and the epitaxial structures 120 are respectively located on two opposite sides of the connection layer 110. In other words, the epitaxial structures 120 are connected with the substrate 100 via the connection layer 110.

The step of forming the connection layer 110 and the plurality of epitaxial structures 120 separated from each other on the substrate 100 is described as follows. First of all, an epitaxial structure layer is formed on the substrate 100. Here, the step of forming the epitaxial structure layer is described as follows. First of all, a semiconductor material layer is formed on the substrate 100, and the semiconductor material layer encapsulates one surface of the substrate 100. The semiconductor material layer may be a multi-layered structure respectively doped with a group IIA element or a group IVA element so as to form a p-type semiconductor layer or an n-type semiconductor layer respectively. In other embodiment, the semiconductor material layer may not be doped with the group IIA element or the group IVA element; the invention provides no limitation thereto.

Subsequently, an active material layer is formed on the semiconductor material layer, and the active material layer encapsulates one surface of the semiconductor material layer. Thereafter, the other semiconductor material layer is formed on the active material layer, and the other semiconductor material layer encapsulates one surface of the active material layer. The semiconductor material layer and the other semiconductor material layer are respectively located on two opposite sides of the active material layer, and the other semiconductor material layer may be a multi-layered structure respectively doped with the group IIA element or the group IVA element so as form the p-type semiconductor layer or the n-type semiconductor layer. In other embodiment, the semiconductor material layer may not be doped with the group IIA element or the group IVA element; the invention provides no limitation thereto. In the embodiment, the material of the semiconductor material layer, the active material layer and the other semiconductor material layer may include a group II-VI material such as zinc selenide (ZnSe), or a group III-V material such as aluminum gallium arsenide (AlGaAs), gallium arsenide phosphide (GaAsP), aluminum gallium indium phosphide (AlGaInP), gallium aluminum phosphide (AlGaP), indium gallium nitride (InGaN), aluminum nitride (AlN), indium nitride (InN), aluminum gallium nitride (AlGaN), aluminum indium gallium nitride (AlInGaN), gallium phosphide (GaP) or gallium nitride (GaN); the invention provides no limitation thereto.

Lastly, a resist-coating process, an exposing process, a lithographing process, an etching process and so on are performed to pattern the epitaxial structure layer (i.e., the semiconductor material layer, the active material layer and the other semiconductor material layer). In other words, the epitaxial structure layer in a specific region is removed, and the portion that is not removed defines the plurality of epitaxial structures 120 separated from each other. On the other hand, in the process of removing the epitaxial structure layer in the specification region, the portion of the semiconductor layer is not removed. At this point, as shown in FIG. 1, each of the epitaxial structures 120 includes a first type semiconductor layer 122, a light emitting layer 124 and a second type semiconductor layer 126, and integrally formed with the connection layer 110 on the substrate 100. The first type semiconductor layer 122 is disposed on the light emitting layer 124, and the light emitting layer 124 is disposed on the second type semiconductor layer 126. The first type semiconductor layer 122 and the second type semiconductor layer 126 are respectively disposed on the two opposite sides of the light emitting layer 124, wherein the second type semiconductor layer 126 is connected with the connection layer 110, and the light emitting layer 124 and the connection layer 110 are respectively located on two opposite sides of the second type semiconductor layer 126.

Specifically, a portion of the semiconductor material layer may form the connection layer 110, and a portion of the semiconductor material layer may form the second type semiconductor layer 126, and another semiconductor material layer doped with the group IIA element or group IVA element may form the first type semiconductor layer 122. If the portion of the semiconductor material layer forming the second type semiconductor layer 126 is doped with the group IVA element such as silicon (Si), then the other semiconductor material layer is doped with the group IIA element such as magnesium (Mg), which should not be construed as a limitation to the invention. On the other hand, if the portion of the semiconductor material layer forming the second type semiconductor layer 126 is doped with the group IIA element such as magnesium (Mg), then the other semiconductor material layer is doped with the group IVA element such as silicon (Si), which should not be construed as a limitation to the invention. That is to say, the first type semiconductor layer 122 and the second type semiconductor layer 126 may be a combination of the p-type semiconductor layer and the n-type semiconductor layer. On the other hand, the light emitting layer 124 may be a multiple quantum well (MQW) structure formed of the active material layer.

Figure 2:
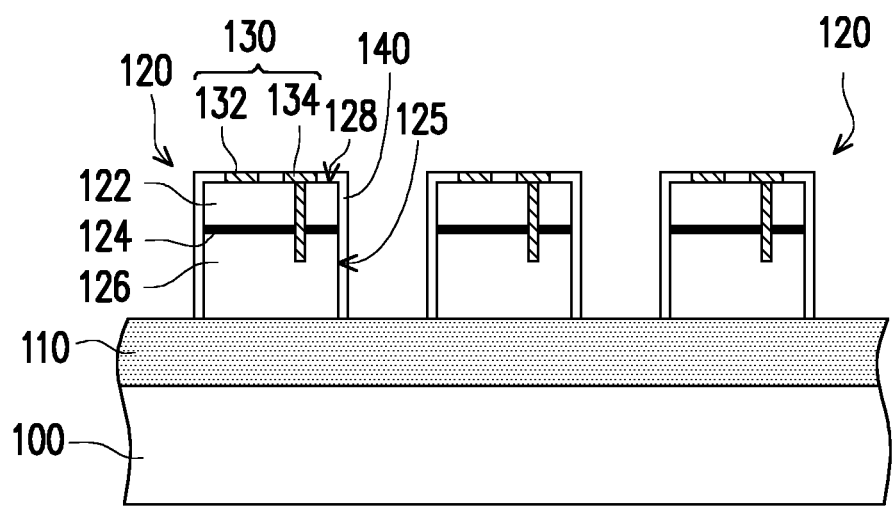

Next, referring to FIG. 2, a first pad 130 is formed on each of the epitaxial structures 120, wherein the first pads 130 and the connection layer 110 are respectively located on two opposite sides of the epitaxial structures 120, and each of the epitaxial structures 120 is electrically connected to the corresponding first pad 130. In the embodiment, each of the epitaxial structures 120 may be a horizontal light emitting diode, wherein each of the first pads 130 is connected to the corresponding first type semiconductor layer 122, and each of first pads 130 and the corresponding light emitting layer 124 are respectively located on two opposite sides of the corresponding first type semiconductor layer 122. Each of the first pads 130 may include a first type electrode 132 and a second type electrode 134 that are electrically different from each other, wherein the first type electrode 132 and the first type semiconductor layer 122 are electrically connected, and the second type electrode 134 and the second type semiconductor layer 126 are electrically connected. The first type electrode 132 and the second type electrode 134 may be a combination of a p-type electrode and an n-type electrode. If the first type semiconductor layer 122 is the p-type semiconductor layer and the second type semiconductor layer 126 is the n-type semiconductor layer, then the first type electrode 132 is the p-type electrode and the second type electrode 134 is the n-type electrode. On the other hand, if the first type semiconductor layer 122 is the n-type semiconductor layer, and the second type semiconductor layer 126 is the p-type semiconductor layer, then the first type electrode 132 is the n-type electrode and the second type electrode 134 is the p-type electrode.

In the embodiment, the epitaxial structures 120 may be micro light emitting diodes (micro LED), wherein the width of each of the epitaxial structures 120 ranges from about 1 to 100 μm, and preferably ranges from about 3 to 50 μm. On the other hand, the overall thickness of each of the epitaxial structures 120 ranges from about 1 to 6 μm, the thickness that is over-thick or over-slim affects the yield of rate in the subsequent process. In each of the epitaxial structures 120, the thickness of the second type semiconductor layer 126 may be larger than the thickness of the first type semiconductor layer 122, wherein the thickness of the second type semiconductor layer 126 ranges from about 1 to 5 μm, the thickness of the light emitting layer 124 ranges from about 0.1 to 1 μm, and the thickness of the first type semiconductor layer 122 ranges from about 0.1 to 0.5 μm, which should not be construed as a limitation to the invention. It should be specifically pointed out that although a cross-sectional shape of each of the epitaxial structures 120 described in the drawings is exemplified as a rectangular shape, the invention provides no limitation thereto. In other embodiment, the cross-sectional shape of the epitaxial structure may be a trapezoid shape or other geometric shape.

Referring to FIG. 2, each of the epitaxial structures 120 has a side wall surface 125 and a bonding surface 128 connected to each other, wherein the bonding surface 128 is the surface where the first pad 130 is disposed, and the side wall surface 125 and the bonding surface 128 are, for example, perpendicular to each other, or an obtuse angle is formed in between, thereby reducing the complexity of the subsequent manufacturing process. In order to prevent moisture from affecting the epitaxial structures 120, it is optional to form an insulating layer 140 on the bonding surface 128 and the side wall surface 125 of each of the epitaxial structures 120, but each of the insulating layers 140 exposes the first pad 130 on the bonding surface 128 of the corresponding epitaxial structure 120 for electrical bonding in the subsequent process. On the other hand, the insulating layer 140 on the side wall surface 125 of the epitaxial structures 120 is connected to the connection layer 110 located between any two adjacent epitaxial structures 120. Here, the material of the insulating layer 140 may be silicon dioxide (SiO2), silicon nitride (Si3N4), aluminum oxide (Al2O3) or a combination thereof. It should be specifically indicated that, in other embodiments, it is optional not to form the insulating layer on the bonding surface and the side wall surface of the epitaxial structures such that the bonding surface and the side wall surface of the epitaxial structures are directly exposed to the outside.

Figure 3:
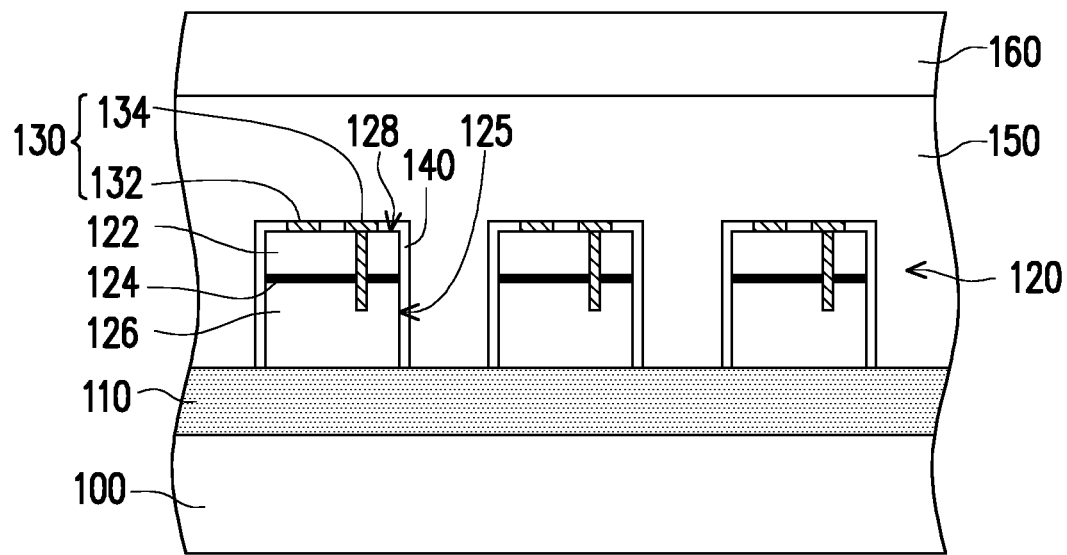

Thereafter, referring to FIG. 3, a first adhesive layer 150 may be formed on the connection layer 110 via a spin-coating process or other proper method, and the first adhesive layer 150 is disposed to encapsulate the epitaxial structures 120, the first pads 130 and the insulating layers 140. In the embodiment, the connection layer 110 may be divided into a portion that is encapsulated by the epitaxial structures 120 and the other portion that is exposed between any two adjacent epitaxial structures 120. The first adhesive layer 150 is filled up into a gap between any two adjacent epitaxial structures 120 so as to encapsulate the connection layer 110 in the gap. In other embodiment, if the side wall surface and the bonding surface of the epitaxial structures are not encapsulated by the insulating layer, then the side wall surface and the bonding surface of the epitaxial structures are encapsulated by the first adhesive layer. Here, the material of the first adhesive layer 150 is, for example, a polymer.

After the first adhesive layer 150 is formed on the connection layer 110, the first substrate 160 is connected with (or adhered to) the first adhesive layer 150, and the first substrate 160 and the substrate 100 are respectively located on two opposite sides of the first adhesive layer 150. Since the relative positions of the epitaxial structures 120 separated from each other on the substrate 100 can be fixed via the connection layer 110, when the first substrate 160 is adhered to the first adhesive layer 150, if the first adhesive layer 150 becomes deformed when being subjected to heat and force during the bonding process, then the relative positions of the epitaxial structures 120 are not shifted due to the effect of the first adhesive layer 150. It should be specifically pointed out that the first substrate 160 and the substrate 100 may be selected from materials having similar thermal expansion coefficient, for example, both of them may be a sapphire substrate, thereby reducing the effect of deformation caused by the difference in thermal expansion coefficient during the bonding process.

Figure 4:
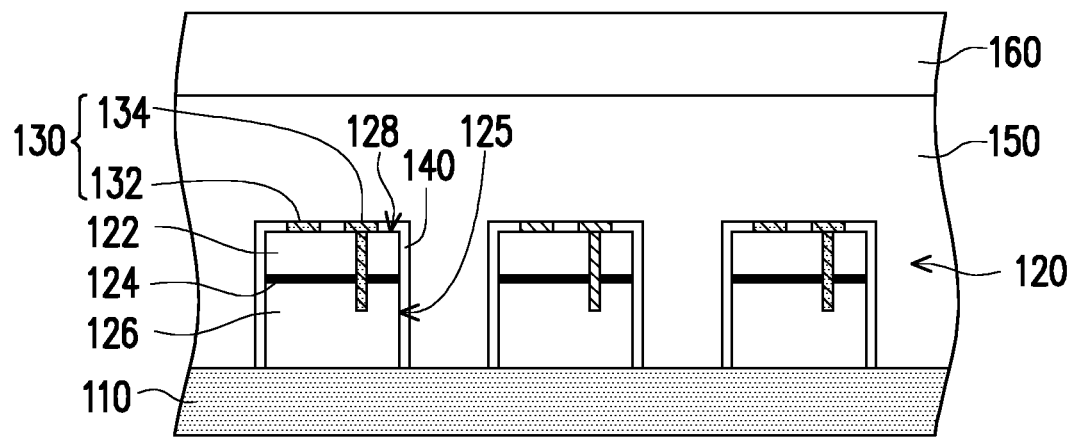
Figure 5:
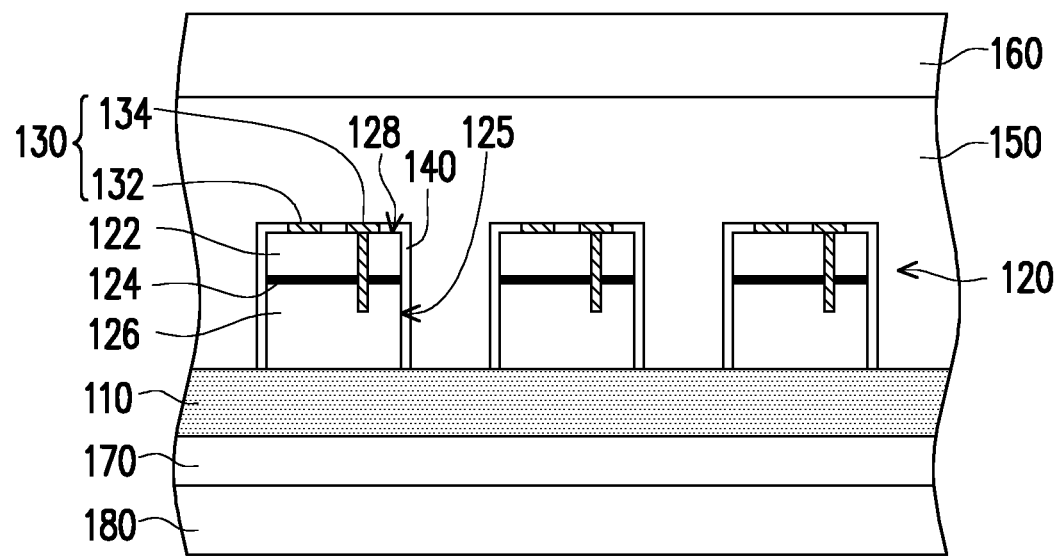

Next, referring to FIG. 4 and FIG. 5, the substrate 100 may be removed via a laser peeling process or other proper removing process so as to expose a side of the connection layer 110 that is not provided with the epitaxial structures 120. Thereafter, a second adhesive layer 170 may be formed on the connection layer 110 via a spin-coating process or other proper method, and a second substrate 180 is connected with (or adhered to) the second adhesive layer 170. That is to say, the second substrate 180 may be connected with the connection layer 110 via the second adhesive layer 170, and the first substrate 160 and the second substrate 180 are respectively disposed on the two opposite sides of the first adhesive layer 150. Here, the material of the first adhesive layer 150 is, for example, a polymer. Since the relative positions of the epitaxial structures 120 separated from each other can be fixed by the connection layer 110, when the second substrate 180 is connected with the connection layer 110 via the second adhesive layer 170, even if the first adhesive layer 150 is deformed due to being subjected to heat or force, the relative positions of the epitaxial structures 120 are not shifted. It should be specifically pointed out that the second substrate 180 and the first substrate 160 may be selected from materials having similar thermal expansion coefficient, for example, both of them may be a sapphire substrate, thereby reducing the effect of deformation caused by the difference in thermal expansion coefficient during the bonding process.

Figure 6:
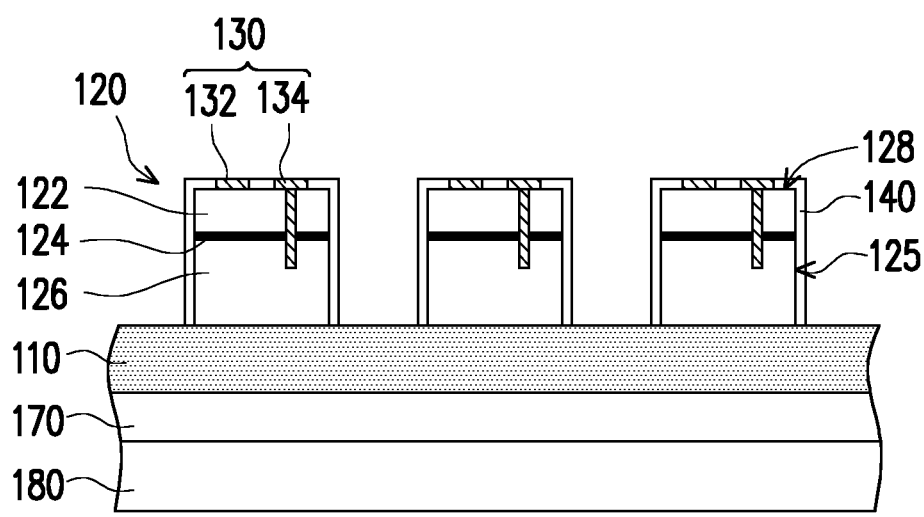

Thereafter, referring to FIG. 6, the first substrate 160 may be removed via the laser peeling process or other proper removing process, and the first adhesive layer 150 may be removed via a laser ablation process, an ultraviolet exposing process, a solution decomposition process or a heat decomposition process, thereby exposing the first pads 130, the epitaxial structures 120, the insulating layers 140 and the connection layer 110 located between any two adjacent epitaxial structures 120. In other embodiment, if the side wall surface and the bonding surface of the epitaxial structures are not encapsulated by the insulating layer, the side wall surface and the bonding surface of the epitaxial structures are exposed to the outside.

Figure 7:
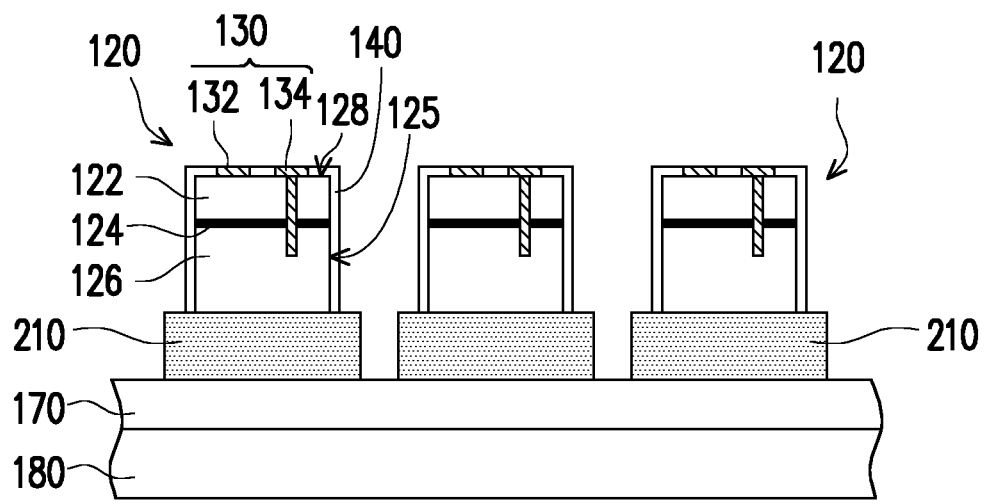

Next, referring to FIG. 6 and FIG. 7, the connection layer 110 located between any two adjacent epitaxial structures 120 may be partially removed via a plasma etching process or other proper removing method so as to form a plurality of connection portions 210 separated from each other, wherein the connection portions 210 are light-transmittable, and the material of the connection portions 210 may include a semiconductor material such as a group III-V semiconductor material, preferably a nitride semiconductor material, more preferably a gallium nitride (GaN) which has greater hardness so as to bear the force during the bonding process. Specifically, the melting point of the connection portions 210 is, for example, larger than 1000° C. and capable of bearing high temperature during the bonding process. In terms of the relative configuration relationship between each of the epitaxial structures 120 and the corresponding connection portion 210, the connection portion 210 is connected to the second type semiconductor layer 126, wherein the connection portion 210 and the light emitting layer 124 are respectively located on two opposite sides of the second type semiconductor layer 126, and the second type semiconductor layer 126 and the first type semiconductor layer 122 are respectively disposed on the two opposite sides of the light emitting layer 124.

In the embodiment, the side edge of each of the connection portions 210 protrudes from the side wall surface 125 of the corresponding epitaxial structure 120, wherein each of the insulating layers 140 is connected to the side edge of the corresponding connection portion 210, and the side edge of each of the connection portions 210 protrudes from the insulating layer 140 of the side wall surface 125 of the corresponding epitaxial structure 120. On the other hand, the orthogonal projection area of each of the connection portions 210 on the second substrate 180 is larger than the orthogonal projection area of the corresponding epitaxial structure 120 on the second substrate 180. That is to say, the orthogonal projection of each of the epitaxial structures 120 on the second substrate 180 falls within the orthogonal projection of the corresponding connection portion 210 on the second substrate 180.

Further referring to FIG. 6 and FIG. 7, when the connection layer 110 located between any two adjacent epitaxial structures 120 is partially removed, a mask (not shown), for example, may be used to encapsulate the epitaxial structures 120, the first pads 130 and a portion of the connection layer 110 located between any two adjacent epitaxial structures 120, and a plasma etching process or other proper removing method may be used to remove the portion of the connection layer 110 that is not encapsulated by the mask (not shown) and located between any two adjacent epitaxial structures 120. In this manner, the side edge of each of the obtained connection portions 210 protrudes from the side wall surface 125 of the corresponding epitaxial structure 120 and the insulating layer 140 thereon, and a gap between any two adjacent connection portions 210 is smaller than a gap between any two adjacent epitaxial structures 120.

Figure 8:
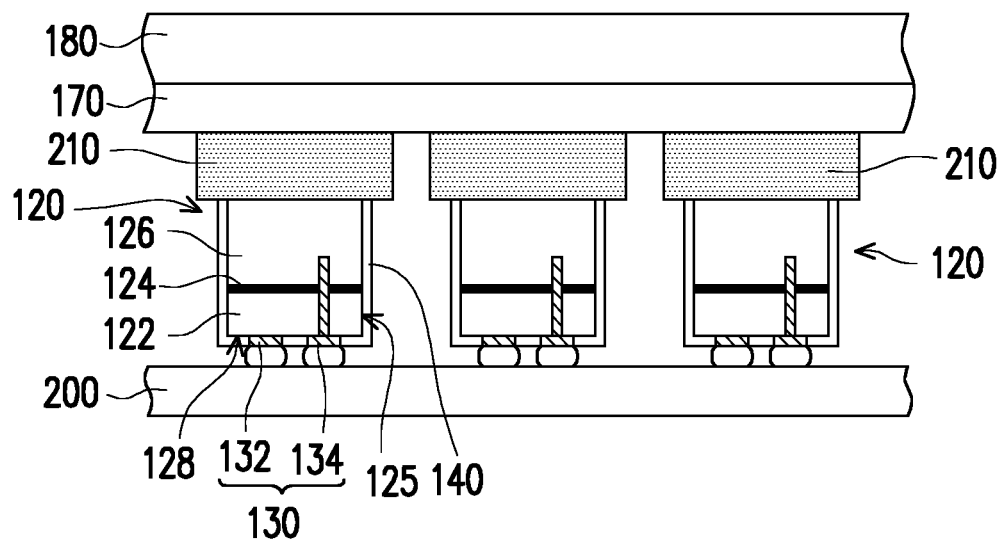

Subsequently, referring to FIG. 8, each of the epitaxial structures 120 is configured to electrically bond the corresponding first pad 130 to the circuit substrate 200 via a thermal bonding process, and the connection portions 210 and the circuit substrate 200 are respectively located on two opposite sides of the epitaxial structures 120. For example, the circuit substrate 200 may be a contemporary metal oxide semiconductor (CMOS) substrate, a liquid crystal on silicon (LCOS) substrate, a thin film transistor (TFT) substrate or other substrate having a working circuit, wherein a side of the circuit substrate 200 bonded to the epitaxial structures 120 is provided with an electrode bonding layer (not shown), and each of the epitaxial structures 120 is configured to be electrically boned to the electrode bonding layer (not shown) through the corresponding first pad 130 via a flip-chip bonding process so as to be electrically connected to the circuit substrate 200. In other embodiment, each of the epitaxial structures may be electrically bonded to the electrode bonding layer on the circuit substrate through the first electrode, the second electrode and a wire using a wire bonding method so as to be electrically connected to the circuit substrate.

In the manufacturing steps described above, the relative positions of the epitaxial structures 120 are not shifted. Therefore, when the epitaxial structures 120 are transferred onto the circuit substrate 200, the first pad 130 on each of the epitaxial structures 120 can be precisely aligned with the electrode bonding layer (not shown) on the circuit substrate 200, thereby improving manufacturing efficiency and yield of rate.

In the embodiment, the orthogonal projection area of each of the connection portions 210 on the circuit substrate 200 is larger than the orthogonal projection area of the corresponding epitaxial structure 120 on the circuit substrate 200. Here, the orthogonal projection of each of the epitaxial structures 120 on the circuit substrate 200 falls within the orthogonal projection of the corresponding connection portions 210 on the circuit substrate 200; alternatively, it may be described that the orthogonal projection of each of the epitaxial structures 120 on the circuit substrate 200 is completely encapsulated by the orthogonal projection of the corresponding connection portions 210 on the circuit substrate 200. Furthermore, a ratio of the orthogonal projection area of each of the connection portions 210 on the circuit substrate 200 to the orthogonal projection area of the corresponding epitaxial structure 120 on the circuit substrate 200 is larger than 1 and smaller than or equal to 1.5; more preferably, the ratio of the orthogonal projection areas is larger than 1 and smaller than or equal to 1.2. If the ratio of the orthogonal projection areas is larger than 1.5, then the epitaxial structures 120 cannot be arranged closely, which affects the application of the epitaxial structures 120 in the micro light emitting diode device in the subsequent process. For example, viewing from a top view, the surface dimension of each of the epitaxial structures 120 is, for example, 8 μm×25 μm or 7 μm×20 μm; the surface dimension of the connection portion 210 is, for example, 10 μm×30 μm or 9 μm×22 μm, the invention provides no limitation thereto.

Figure 9:
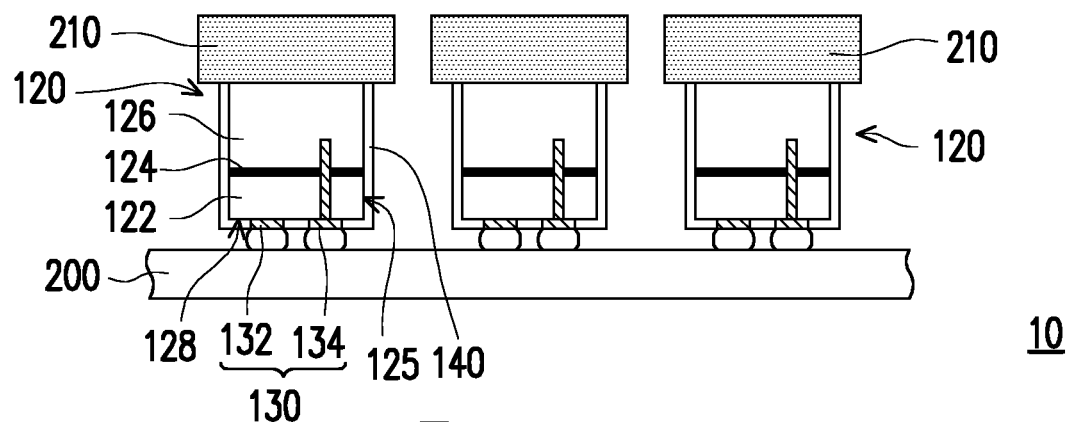

Lastly, referring to FIG. 9, the second substrate 180 is removed via a laser peeling process or other proper removing method. Subsequently, the second adhesive layer 170 is removed via a wet-etching process or other proper removing method; the invention provides no limitation thereto. In the embodiment, each of the connection portions 210 and the corresponding second type semiconductor layer 126 are connected together, wherein a ratio of the thickness of each of the connection portions 210 to the overall thickness of the corresponding epitaxial structure 120 is smaller than or equal to 0.8; preferably, the ratio of the thickness of the each of connection portions 210 to the overall thickness of the corresponding epitaxial structure 120 is smaller than or equal to 0.5; more preferably, the ratio of the thickness of each of the connection portions 210 and the overall thickness of the corresponding epitaxial structure 120 is smaller than or equal to 0.3.

The above-described manufacturing steps show that the connection portions 210 separated from each other are formed by partially removing the connection layer 110. If the ratio of the thickness of each of the connection portions 210 to the overall thickness of the corresponding epitaxial structure 120 is smaller, it represents that the ratio of the thickness of the connection layer 110 to the overall thickness of each of the epitaxial structures 120 is smaller too. If the ratio of the thickness of the connection layer 110 to the overall thickness of the corresponding epitaxial structure 120 is larger than 0.8, it becomes more difficult to partially remove the over-thick connection layer 110, which reduces the yield of rate in the process of forming each of the connection portions 210. Here, the thickness of each of the connection portions 210 may be larger than a sum of the thickness of the corresponding second type semiconductor layer 126 and the thickness of the corresponding light emitting layer 124. More preferably, the thickness of each of the second type semiconductor layer 126 is larger than the thickness of the corresponding connection portion 210, such that the relative positions of the epitaxial structures 120 are not easily changed and the process of partially removing the connection layer 110 can be simpler.

For example, the thickness of each of the epitaxial structures 120 is, for example, 5 μm, and the thickness of the connection portion 210 is, for example, 1 μm; the invention provides no limitation thereto. It should be specifically indicated that the ratio of the thickness of the connection portion 210 to the maximum width of the epitaxial structure 120 ranges from 0.001 to 0.3. If the ratio is smaller than 0.001, the thickness of the connection portion 210 is too thin; insufficient connection force may cause the relative positions of the epitaxial structures 120 to be change in the manufacturing process. If the ratio if larger than 0.3, the thickness of the connection portion 210 is over thick, which is likely to make it difficult to partially remove the over-thick connection layer 110 and reduce the yield of rate of the process of forming each of the connection portions 210. Preferably, when the maximum width of the epitaxial structure 120 is smaller than 50 µm, the ratio of the thickness of the connection portion 210 to the maximum width of the epitaxial structure 120 ranges from 0.002 to 0.2. When the maximum width of the epitaxial structure 120 is larger than or equal to 50 µm, the ratio of the thickness of the connection portion 210 to the maximum width of the epitaxial structure 120 ranges from 0.001 to 0.04.

FIG. 9 illustrates a structural aspect of the epitaxial structure 120 that can emit one of color light after it is transferred to the circuit substrate 200, which is a portion of the micro light emitting diode device 10. Since the first pad 130 on each of the epitaxial structures 120 can be precisely aligned with the electrode bonding layer (not shown) on the circuit substrate 200, the micro light emitting diode device 10 has good reliability. It should be pointed out that the electrode bonding layer (not shown) on the circuit substrate 200 may be selectively disposed on the circuit substrate 200 so that a number of the epitaxial structures 120 is bonded to an area of the circuit substrate 200 provided with the electrode bonding layer (not shown) via the first pad 130.

In the embodiment, the micro light emitting diode device 10 includes the circuit substrate 200, the plurality of epitaxial structures 120, the plurality of first pads 130 and the plurality of connection portions 210. The epitaxial structures 120 are disposed on the circuit substrate 200 and separated from each other. The first pads 130 are respectively disposed on the epitaxial structures 120, and each of the epitaxial structures 120 are electrically bonded to the circuit substrate 200 via the corresponding first pad 130. The connection portions 210 are respectively disposed on the epitaxial structures 120, wherein the connection portions 210 and the circuit substrate 200 are respectively disposed on the two opposite sides of the epitaxial structures 120, and the epitaxial structures 120 and the circuit substrate 200 are respectively located on two opposite sides of the first pads 130. On the other hand, the side edge of each of the connection portions 210 protrudes from the side wall surface 125 of the corresponding epitaxial structure 120.

The insulating layer 140 may be formed on the bonding surface 128 and the side wall surface 125 of each of the epitaxial structures 120, but the first pad 130 on the bonding surface 128 of each of the epitaxial structures 120 is exposed to the outside of the corresponding insulating layer 140. On the other hand, the side edge of each of the connection portions 210 protrudes from the insulating layer 140 on the side wall surface 125 of the corresponding epitaxial structure 120. In other embodiment, the bonding surface and the side wall surface of the epitaxial structures may not be provided with the insulating layer, such that the bonding surface and the side wall surface of the epitaxial structures are directly exposed to the outside.

In the embodiment, the first type electrode 132 and the second type electrode 134 of the first pad 130 of each of the epitaxial structures 120 are electrically connected with the first type semiconductor layer 122 and the second type semiconductor layer 121 respectively, and electrically connected to the circuit substrate 200. The light emitting layer 124 is disposed on the first type semiconductor layer 122. The second type semiconductor layer 126 is disposed on the light emitting layer 124, and the first type semiconductor layer 122 and the second type semiconductor layer 126 are respectively disposed on the two opposite sides of the light emitting layer 124.

Figure 10:
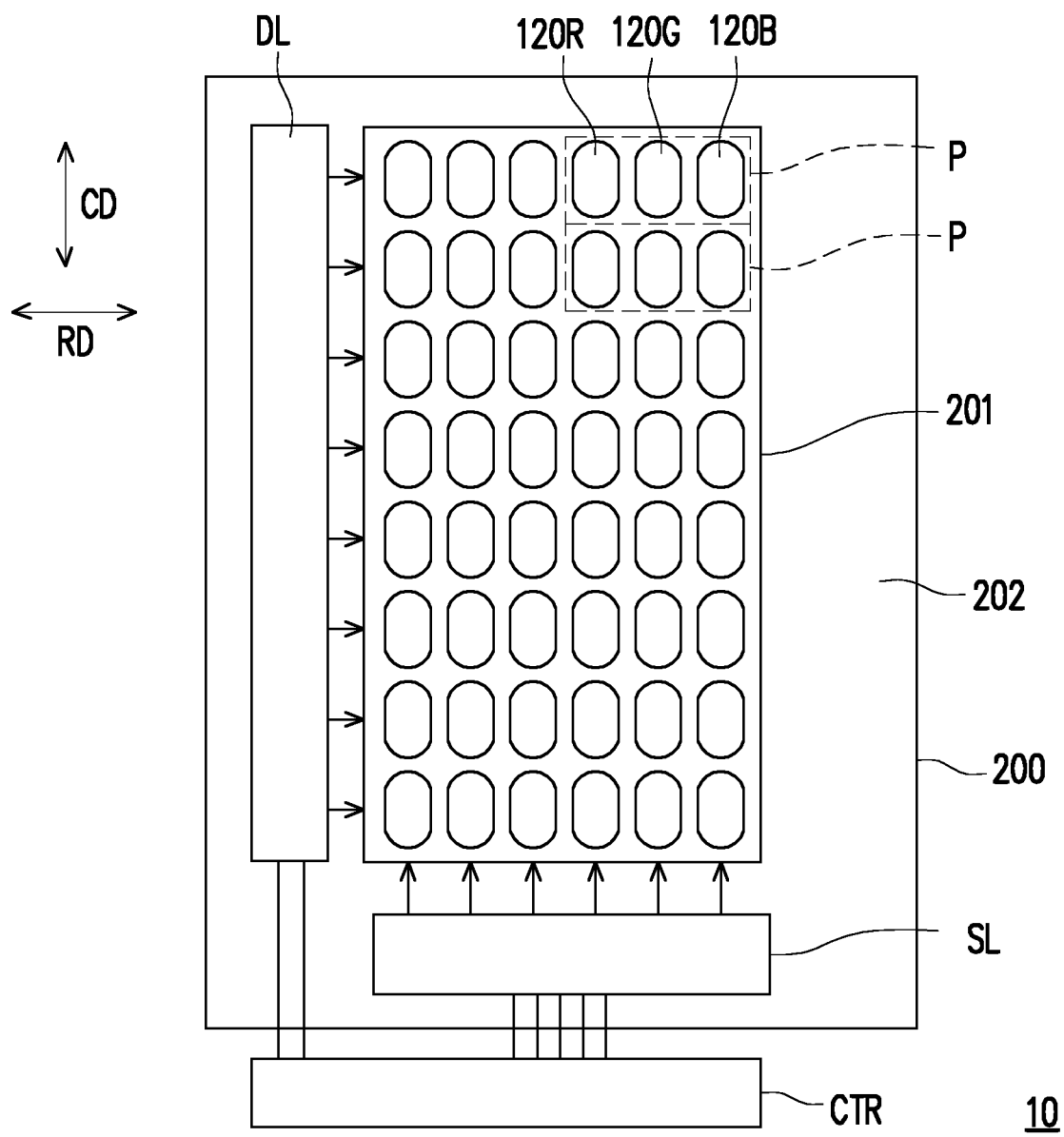
FIG. 10 is a top view illustrating a micro light emitting diode device according to an embodiment of the invention.
Figure 11:
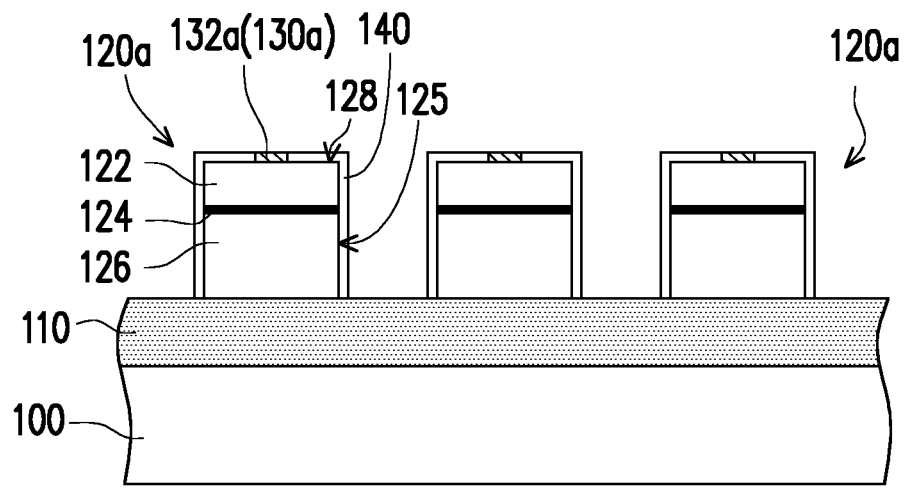
FIG. 11 to FIG. 18 are cross-sectional views illustrating a micro light emitting diode device according to another embodiment of the invention.
Figure 12:
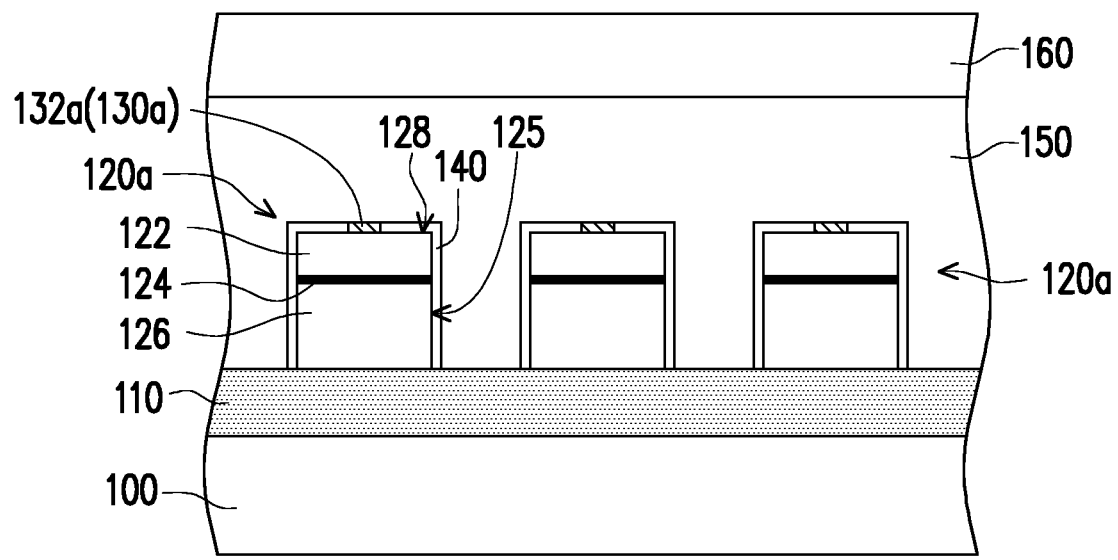
Figure 13:
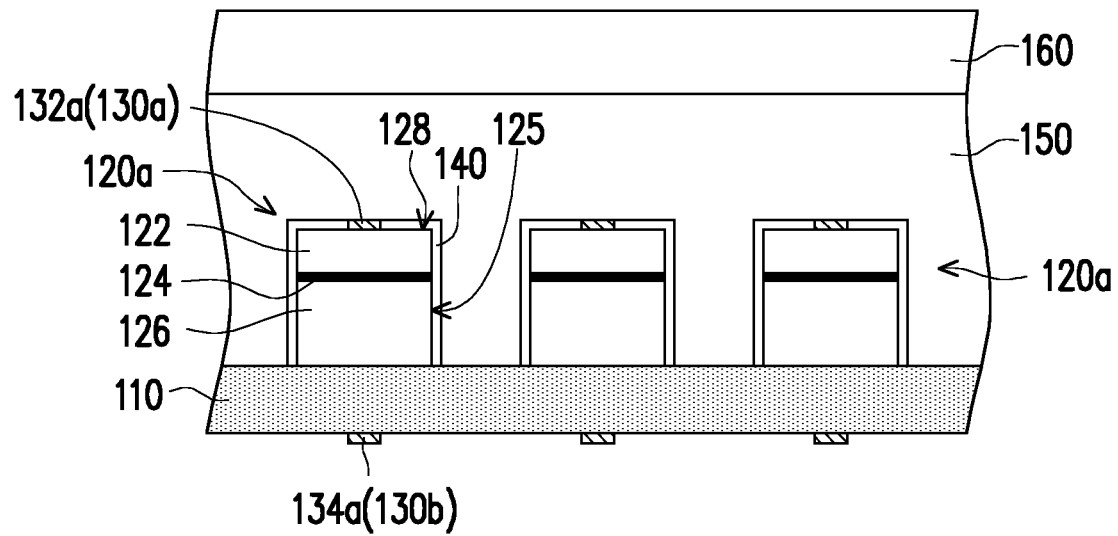
Figure 14:
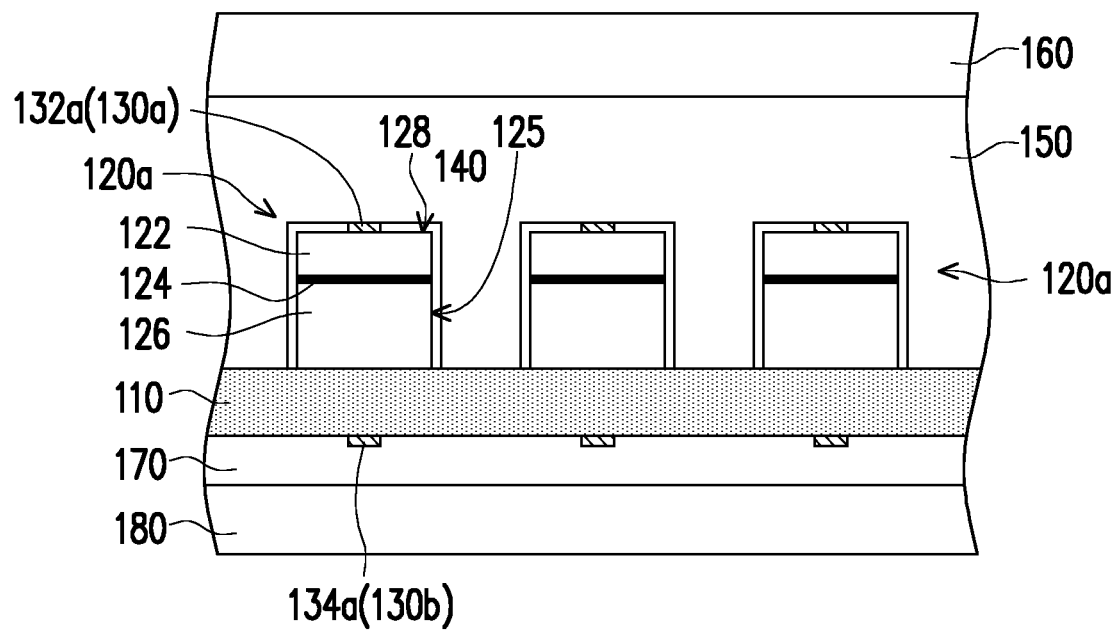
Figure 15:
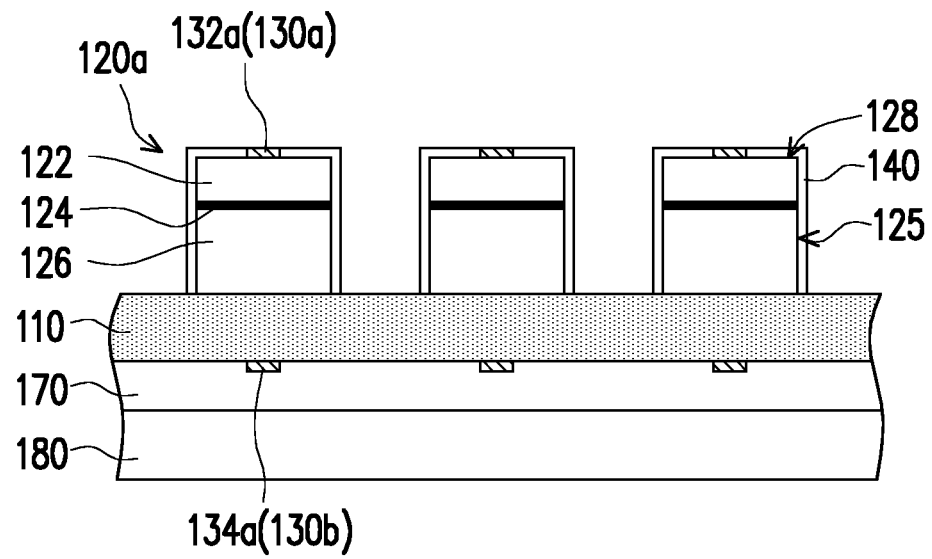
Figure 16:
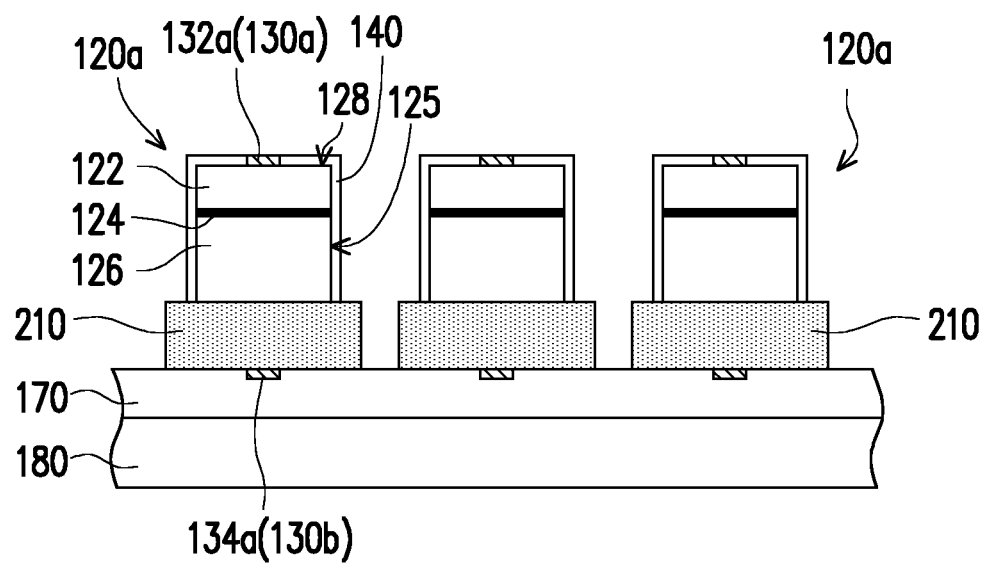
Figure 17:
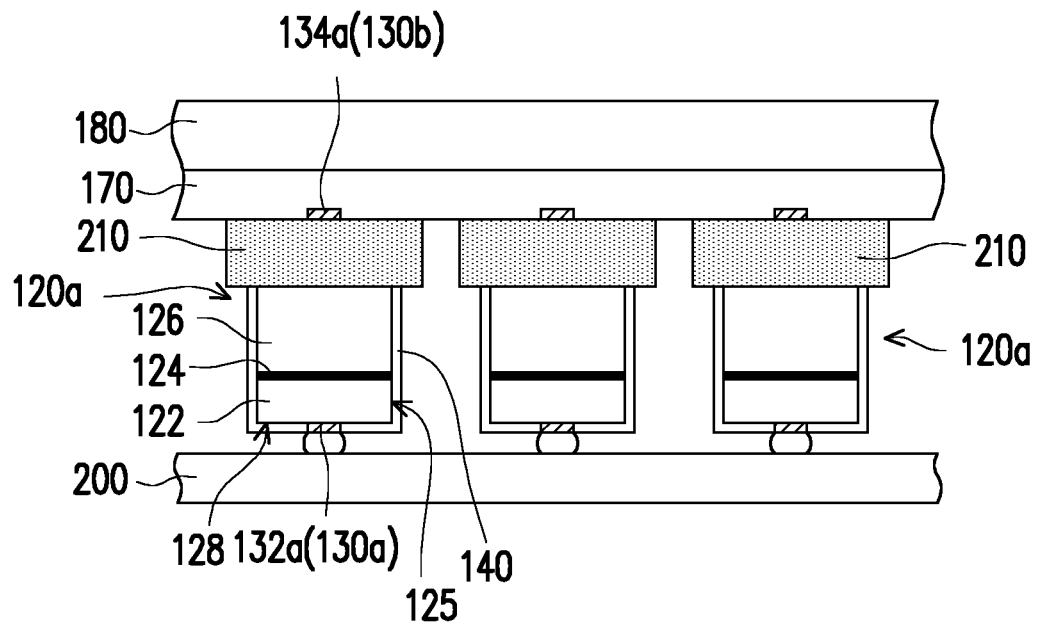

FIG. 10 is a top view illustrating a micro light emitting diode device according to an embodiment of the invention. Referring to FIG. 10, in the embodiment, the micro light emitting diode device 10 is practically implemented as a micro light emitting diode display panel. Practically, the above-mentioned manufacturing steps can be carried out to respectively obtain an epitaxial structure 120R (or referred to as a red light-emitting diode) having a red light-emitting layer, an epitaxial structure 120G (or referred to as a green light-emitting diode) having a green light-emitting layer and an epitaxial structure 120B (or referred to as a blue light-emitting diode) having a blue light-emitting layer; the micro light emitting diode device 10 can be obtained by transferring the epitaxial structure 120R, the epitaxial structure 120G and the epitaxial structure 120B to the circuit substrate 200 respectively. Specifically, the epitaxial structure 120R are formed as one column on the circuit substrate 200, the epitaxial structure 120G are formed as one column on the circuit substrate 200 and the epitaxial structure 120B are formed as one column on the circuit substrate 200. Therefore, in a row direction RD perpendicular to the column direction CD, the arrangement in the order of epitaxial structure 120R, epitaxial structure 120G and epitaxial structure 120B may be repeated. In other embodiment, the sequence of arrangement of the red light-emitting diode, the green light-emitting diode and the blue light-emitting diode in the row direction RD may be adjusted depending on the actual requirement; the invention provides no limitation thereto.

The circuit substrate 200 may be divided into a display area 201 and a non-display area 202. The epitaxial structure 120R, the epitaxial structure 120G and the epitaxial structure 120B arranged adjacently in sequence in the row direction RD may construct a pixel structure P, and disposed in the display area 201. In other words, at least three epitaxial structures may construct a pixel structure P. On the other hand, a data driving circuit DL and a scan driving circuit SL are disposed in the non-display area 202, wherein the data driving circuit DL is electrically connected to each of the pixel structures P to transmit a data signal to the epitaxial structure 120R, the epitaxial structure 120G and the epitaxial structure 120B in each of the pixel structures P, wherein the scan driving circuit SL is electrically connected to each of the pixel structures P to transmit a scan signal to the epitaxial structure 120R, the epitaxial structure 120G and the epitaxial structure 120B in each of the pixel structures P. Each of the pixel structures P is electrically connected a control device CTR via the data driving circuit DL and the scan driving circuit SL, wherein the control device CTR is configured to send a control signal to the data driving circuit DL and the scan driving circuit SL. The data driving circuit DL and the scan driving circuit SL that receive the control signal respectively send the data signal and the scan signal to each of the pixel structures P so as to control and drive the light emitted by the epitaxial structure 120R, the epitaxial structure 120G and the epitaxial structure 120B in each of the pixel structures P.

FIG. 11 to FIG. 18 are cross-sectional views illustrating a manufacturing method of a micro light emitting diode device according to another embodiment of the invention. Referring to FIG. 11 to FIG. 18, the epitaxial structure 120a obtained in the embodiment may be a vertical light emitting diode which is different from the horizontal light emitting diode in the previous embodiment. The manufacturing steps described in the two embodiments are basically the same but slightly different from each other. Therefore, the same reference numerals are used in the following descriptions to represent the same or similar elements, and identical technical content is omitted. The following paragraphs are dedicated to differences between the two embodiments. The previous embodiment may serve as reference for the omitted descriptions; no repetitions are incorporated herein.

In the embodiment, the first pad 130a formed on each of the first type semiconductor layer 122 is a single electrode. After the substrate 100 is removed, a plurality of second pads 130b are formed on the connection layer 110 in corresponding to each of the epitaxial structures 120a, wherein the second pads 130b and the epitaxial structures 120a are respectively located on two opposite sides of the connection layer 110, and the two opposite sides of each of the epitaxial structures 120a are respectively provided with one first pad 130a and one second pad 130b.

Furthermore, here, the second pad 130a is a single electrode and the second pad 130b is a single electrode. However, in other embodiment, the first pad and second pad may be a plurality of electrodes. The invention provides limitation thereto. The first pad 130a and the second pad 130b formed in pairs may include a first type electrode 132a and a second type electrode 134a that are electrically different from each other, wherein the first type electrode 132a and the first type semiconductor layer 122 are electrically connected, and the second type electrode 134a and the second type semiconductor 126 are electrically connected. In the embodiment, the second type electrodes 134a are electrically connected to the second type semiconductor layers 126 via the connection layer 110. In other embodiment, the second pads may be electrically connected to the second type semiconductor layers respectively via a plurality of conductive through holes that respectively penetrate through the connection layer, which should not be construed as a limitation to the invention. In the embodiment, the first type electrode 132a and the second type electrode 134a may be a combination of p-type electrode and n-type electrode. If the first type semiconductor layer 122 is the p-type semiconductor layer and the second type semiconductor layer 126 is the n-type semiconductor layer, then the first type electrode 132a is the p-type electrode and the second type electrode 134a is the n-type electrode. On the other hand, if the first type semiconductor layer 122 is the n-type semiconductor layer, and the second type semiconductor layer 126 is the p-type semiconductor layer, then the first type electrode 132a is the n-type electrode and the second type electrode 134a is the p-type electrode.

Figure 18:
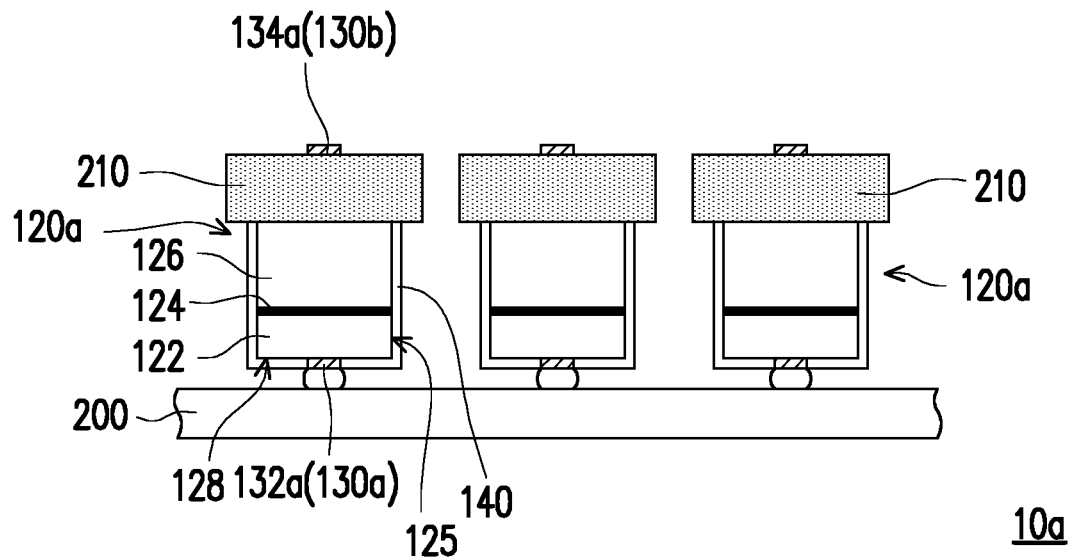

On the other hand, when the second substrate 180 is connected with the connection layer 110 via the second adhesive layer 170, the second pads 130b are encapsulated by the second adhesive layer 170. Lastly, when the epitaxial structures 120a are transferred onto the circuit substrate 200, each of the epitaxial structures 120a is electrically bonded to the electrode bonding layer (not shown) via the first pad 130a so as to be electrically connected to the circuit substrate 200. As shown in FIG. 18, the first pad 130a and the second pad 130b that are disposed in pairs are respectively disposed on the two opposite sides of the corresponding epitaxial structure 120a, wherein each of the first pads 130a is disposed located the corresponding first type semiconductor layer 122 and the circuit substrate 200.

Furthermore, each of the light emitting layers 124 is disposed on the corresponding first type semiconductor layer 122, each of the second type semiconductor layer 126 is disposed on the corresponding light emitting layer 124, and each of the first type semiconductor layer 122 and the corresponding second type semiconductor layer 126 are respectively disposed on the two opposite sides of the corresponding light emitting layer 124. On the other hand, each of the connection portions 210 and the corresponding second type semiconductor layer 126 are connected together, and each of the second pads 130b and the corresponding second type semiconductor layer 126 are respectively located on two opposite sides of the corresponding connection portion 210. For example, each of the second type electrodes 134a may be a transparent electrode; therefore, the light emitted by the corresponding epitaxial structure 120a is not affected.

FIG. 18 illustrates a structural aspect of the epitaxial structure 120a that can emit one of color light after it is transferred to the circuit substrate 200, which is a portion of a micro light emitting diode device 10a. Since a first pad 130a on each of the epitaxial structures 120a can be precisely aligned with the electrode bonding layer (not shown) on the circuit substrate 200, the micro light emitting diode device 10a has good reliability.

Practically, the above-mentioned manufacturing steps can be carried out to respectively obtain the epitaxial structure having a red light-emitting layer (or referred to as red light-emitting diode), the epitaxial structure having a green light-emitting layer (or referred to as green light-emitting diode) and the epitaxial structure having a blue light-emitting layer (or referred to as blue light-emitting diode); lastly, the micro light emitting diode device 10a can be obtained by respectively transferring the red light-emitting diode, the green light-emitting diode and the blue light-emitting diode to the circuit substrate 200. From a top view of the micro light emitting diode device 10a, the aspect thereof is similar to the micro light emitting diode device 10 in FIG. 10. The difference between the two is that the micro light emitting diode device 10a includes a plurality of vertical light emitting diodes, and the micro light emitting diode device 10 includes a plurality of horizontal light emitting diodes.

In summary, in the manufacturing process of the micro light emitting diode device of the invention, the relative positions of the plurality of epitaxial structures on the substrate (e.g., growth substrate) may be fixed via the connection layer. When the first substrate is adhered to the first adhesive layer, if the first adhesive layer is deformed due to being subjected to force, the relative positions of the epitaxial structures are not shifted due to the effect of the first adhesive layer. On the other hand, in the steps of forming the second adhesive layer on the connection layer and adhering the second substrate to the second adhesive layer, even if the first adhesive layer is deformed due to being subjected to heat or force, the relative positions of the epitaxial structures are not shifted due to the effect of the first adhesive layer. Therefore, when the epitaxial structures are transferred onto the circuit substrate, the pads on each of the epitaxial structures can be precisely aligned with the electrode bonding layer on the circuit substrate. In other words, the manufacturing method of the micro light emitting diode device of the invention facilitates to improve manufacturing efficiency and yield of rate, and the obtained micro light emitting diode device can have good reliability.

Although the invention has been disclosed by the above embodiments, the embodiments are not intended to limit the invention. It will be apparent to those skilled in the art that various modifications and variations can be made to the structure of the invention without departing from the scope or spirit of the invention. Therefore, the protecting range of the invention falls in the appended claims.

What is claimed is:

1. A micro light emitting diode device, comprising:
a circuit substrate;
a plurality of epitaxial structures, disposed on the circuit substrate and separated from each other;
a plurality of first pads, respectively disposed on the epitaxial structures, and each of the epitaxial structures is electrically bonded to the circuit substrate via the corresponding first pad; and
a plurality of connection portions, respectively and correspondingly disposed on the epitaxial structures, wherein the connection portions and the circuit substrate are respectively located on two opposite sides of the epitaxial structures, and the epitaxial structures and the circuit substrate are respectively located on two opposite sides of the first pads, a side edge of each of the connection portions protrudes from a side wall surface of the corresponding epitaxial structure, and each of the connection portions directly contact the corresponding epitaxial structure,
wherein a material of the connection portions comprises a semiconductor material.

2. The micro light emitting diode device according to claim 1, wherein an orthogonal projection area of each of the connection portions on the circuit substrate is larger than an orthogonal projection area of the corresponding epitaxial structure on the circuit substrate.

3. The micro light emitting diode device according to claim 2, wherein a ratio of the orthogonal projection area of each of the connection portions on the circuit substrate to the orthogonal projection area of the corresponding epitaxial structures on the circuit substrate is larger than 1 and smaller than or equal to 1.5.

4. The micro light emitting diode device according to claim 1, wherein a ratio of a thickness of each of the connection portions to a thickness of the corresponding epitaxial structure is smaller than or equal to 0.8.

5. The micro light emitting diode device according to claim 1, further comprising:
a plurality of second pads, respectively disposed on the connection portions, wherein each of the second pads and the corresponding epitaxial structure are respectively located on two opposite sides of the corresponding connection portion, and the two opposite sides of each of the epitaxial structures are respectively provided with one of the first pads and one of the second pads.

6. The micro light emitting diode device according to claim 1, wherein each of the epitaxial structures comprises:
a first type semiconductor layer, disposed on the circuit substrate;
a light emitting layer, disposed on the first type semiconductor layer;
a second type semiconductor layer, disposed on the light emitting layer, and the first type semiconductor layer and the second type semiconductor layer are respectively located on two opposite sides of the light emitting layer.

7. The micro light emitting diode device according to claim 6, wherein each of the second type semiconductor layer and the corresponding connection portion are connected together, and a thickness of each of the second type semiconductor layers is larger than a thickness of the corresponding connection portion.

8. The micro light emitting diode device according to claim 6, wherein each of the second type semiconductor layers and the corresponding connection portion are connected together, and a thickness of each of the connection portions is larger than a sum of a thickness of the first type semiconductor layer and a thickness of the corresponding light emitting layer.

9. The micro light emitting diode device according to claim 1, wherein the material of the connection portions comprises a group III-V semiconductor material.

10. The micro light emitting diode device according to claim 1, wherein a melting point of a material of the connection portions is larger than 1000° C.

11. The micro light emitting diode device according to claim 1, wherein each of the epitaxial structures has a bonding surface connected with the side wall surface, and each of the first pads is disposed on the bonding surface of the corresponding epitaxial structure, the side wall surface of each of the epitaxial structures and the bonding surface are encapsulated by an insulating layer, and each of the insulating layers exposes the first pad on the bonding surface of the corresponding epitaxial structure.

* * * * *